(12) United States Patent
Li

(10) Patent No.: US 11,079,879 B1
(45) Date of Patent: Aug. 3, 2021

(54) FLEXIBLE TOUCH DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuanhang Li, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/652,425

(22) PCT Filed: Feb. 27, 2020

(86) PCT No.: PCT/CN2020/077051
§ 371 (c)(1),
(2) Date: Mar. 31, 2020

(30) Foreign Application Priority Data

Jan. 22, 2020 (CN) .......................... 202010074959.5

(51) Int. Cl.
*G06F 3/041* (2006.01)
*G06F 3/044* (2006.01)
(Continued)

(52) U.S. Cl.
CPC ........ *G06F 3/04186* (2019.05); *G06F 3/0445* (2019.05); *G06F 3/0446* (2019.05);
(Continued)

(58) Field of Classification Search
CPC .. G06F 3/04186; G06F 3/0445; G06F 3/0446; G06F 3/04164; G06F 3/0448;
(Continued)

(56) References Cited

U.S. PATENT DOCUMENTS

2010/0117975 A1  5/2010  Cho
2011/0007010 A1  1/2011  Chen et al.
(Continued)

FOREIGN PATENT DOCUMENTS

CN  101739171 A  6/2010
CN  101950231 A  1/2011
(Continued)

*Primary Examiner* — Mark Edwards
(74) *Attorney, Agent, or Firm* — Mark M. Friedman

(57) ABSTRACT

A flexible touch display device includes a flexible display panel, bridge points, sensing electrodes, a first insulating layer, and touch electrodes. The bridge points and the sensing electrodes are disposed on a display area and a peripheral area of the flexible display panel, respectively. The first insulating layer covers the bridge points, the sensing electrodes, and the flexible display panel, and is provided with via holes in the display area to expose two opposite sides of each bridge point. The touch electrodes are disposed on the first insulating layer in the display area and electrically connected to the bridge points through the via holes to form a metal mesh structure. The sensing electrodes are configured to sense a bending position and a bending degree of the flexible display panel that are used to compensate and correct a touched position sensed by the touch electrodes in the bending position.

10 Claims, 15 Drawing Sheets

(51) Int. Cl.
  *H01L 27/32* (2006.01)
  *H01L 51/00* (2006.01)
(52) U.S. Cl.
  CPC ........ *G06F 3/0448* (2019.05); *G06F 3/04164*
    (2019.05); *H01L 27/323* (2013.01); *H01L*
    *27/3244* (2013.01); *H01L 51/0097* (2013.01);
    *G06F 3/0443* (2019.05); *G06F 2203/04102*
    (2013.01); *G06F 2203/04111* (2013.01); *G06F*
    *2203/04112* (2013.01); *H01L 2251/5338*
    (2013.01)
(58) Field of Classification Search
  CPC ......... G06F 3/0443; G06F 2203/04102; G06F
    2203/04111; G06F 2203/04112; H01L
    51/0097; H01L 27/323; H01L 27/3244;
    H01L 2251/5338
  USPC .......................................................... 345/174
  See application file for complete search history.

(56) References Cited

U.S. PATENT DOCUMENTS

| | | | |
|---|---|---|---|
| 2012/0256720 A1* | 10/2012 | Byun ..................... | H01C 10/10 338/2 |
| 2013/0300677 A1 | 11/2013 | Kim et al. | |
| 2014/0204059 A1* | 7/2014 | Geaghan ............... | G06F 3/0421 345/174 |
| 2015/0169091 A1* | 6/2015 | Ho ........................ | G06F 3/0416 345/173 |
| 2016/0202831 A1* | 7/2016 | Kim ...................... | G06F 3/0443 345/173 |
| 2016/0216822 A1* | 7/2016 | Jang ..................... | G02F 1/13338 |
| 2016/0282989 A1* | 9/2016 | Hirakata ............... | G06F 3/0443 |
| 2017/0308201 A1 | 10/2017 | Xie et al. | |
| 2018/0032106 A1 | 2/2018 | Yu et al. | |
| 2019/0094006 A1* | 3/2019 | Cao ....................... | G06F 1/1652 |
| 2019/0198801 A1 | 6/2019 | Kuon et al. | |

FOREIGN PATENT DOCUMENTS

| | | | | |
|---|---|---|---|---|
| CN | 103389822 A | 11/2013 | | |
| CN | 105159515 A | 12/2015 | | |
| CN | 105487734 A | 4/2016 | | |
| CN | 107665657 A | 2/2018 | | |
| KR | 20180013232 A | * | 2/2018 | |
| WO | WO-2020087298 A1 | * | 5/2020 | ............. G06F 3/044 |

\* cited by examiner

FLEXIBLE TOUCH DISPLAY DEVICE

FIELD OF INVENTION

The present disclosure relates to the technical field of display, and particularly to a flexible touch display device.

BACKGROUND

Organic light-emitting diode (OLED) display panels have advantages of lightness, thin profile, active illumination, fast response times, wide viewing angles, wide color gamut, high brightness, low power consumption, and flexibility, and thus have become mainstream in display panel technology. Currently, a flexible touch display device comprising an organic light emitting diode display panel and a touch structure is a focus of research and development in the industry.

Please refer to FIG. 1, a current flexible touch display device 100 comprises an organic light emitting diode display panel 10, a plurality of first touch electrodes 21, and a plurality of second touch electrodes 22. The first touch electrodes 21 and the second touch electrodes 22 are disposed on the organic light emitting diode display panel 10 and form a mutual-capacitance touch electrode shaped as a metal mesh. The first touch electrodes 21 and the second touch electrodes 22 are electrically connected to a touch chip through leads. When a finger or a stylus touches a position in a touch display area of the flexible touch display device 100, a capacitance between the first touch electrode 21 and the second touch electrode 22 in the touched position will be changed. The touch chip can recognize the touched position by processing a change amount of the capacitance.

As shown in FIG. 2, when the flexible touch display device 100 is in a bent state, a distance between the first touch electrode 21 and the second touch electrode 22 changes, so that a capacitance between the first touch electrode 21 and the second touch electrode 22 also changes accordingly, thereby causing the touch chip to misjudge the touched position.

Therefore, there is a need to develop a new flexible touch display device to solve the technical problem of misjudgment of a touched position caused by a change in a capacitance between touch electrodes in a bending position when a current flexible touch display device is bent.

SUMMARY OF DISCLOSURE

In order to solve the technical problem that a current flexible touch display device is prone to misjudgment of a touched position when bending, the present disclosure provides a flexible touch display device comprising a flexible display panel, a plurality of bridge points, a plurality of sensing electrodes, a first insulating layer, and a plurality of touch electrodes. The flexible display panel comprises a display area and a peripheral area surrounding the display area. The bridge points are disposed on the display area of the flexible display panel. The sensing electrodes are disposed on the peripheral area of the flexible display panel and configured to sense a bending position and a bending degree of the flexible display panel. The first insulating layer covers the bridge points, the sensing electrodes, and the flexible display panel. The first insulating layer is provided with a plurality of via holes in the display area to expose two opposite sides of each of the bridge points. The touch electrodes are disposed on the first insulating layer in the display area and electrically connected to the bridge points through the via holes to form a metal mesh structure for sensing a touched position of the flexible touch display device.

In an embodiment, the flexible touch display device further comprises a plurality of touch electrode leads and a touch chip. The touch electrode leads are disposed on the first insulating layer in the peripheral area and electrically connected to the touch electrodes. The touch chip is electrically connected to the touch electrode leads. When the display area is touched, the touch electrodes in the touched position generate a touch signal. The touch signal is transmitted to the touch chip through the touch electrode leads, and the touch chip recognizes the touched position by processing the touch signal.

In an embodiment, the touch signal is a capacitance change amount between the touch electrodes in the touched position.

In an embodiment, the sensing electrodes are electrically connected to the touch chip. When the flexible touch display device is touched in a bent state, the sensing electrodes in the bending position generate a bending signal to the touch chip. After the touch chip recognizes the bending position and the bending degree by processing the bending signal, the touch chip compensates and corrects the touch signal generated by the touch electrodes in the bending position.

In an embodiment, each of the sensing electrodes comprises a comb-shaped transmitting electrode and a comb-shaped receiving electrode. The transmitting electrode and the receiving electrode generate a capacitance. The bending signal is a capacitance change amount between the transmitting electrode and the receiving electrode of the sensing electrode in the bending position.

In an embodiment, the sensing electrodes comprise a plurality of driving sensing wires and a plurality of receiving sensing wires perpendicularly crossing each other. Each of the driving sensing wires and each of the receiving sensing wires generate a capacitance at their intersection. The bending signal is a capacitance change amount at the intersection of the driving sensing wire and the receiving sensing wire in the bending position In an embodiment, the sensing electrodes comprise a plurality of conductive lines crossing each other perpendicularly. The conductive lines generate capacitances with the ground. The bending signal is a capacitance change amount between the conductive line in the bending position and the ground.

In an embodiment, each of the sensing electrodes comprises two conductive layers and a plurality of spacers separating the two conductive layers. The bending signal is a voltage change amount caused by the two conductive layers in contact with each other in the bending position.

In an embodiment, the flexible touch display device further comprises a scroll connected to a side of the flexible touch display device for rolling or unrolling the flexible touch display device. The sensing electrodes are disposed on a side of the peripheral area that is parallel to the scroll.

In an embodiment, the bridge points are disposed in an array in the display area. The sensing electrodes are disposed in the peripheral area and are in a same row or a same column as the bridge points.

In the flexible touch display device provided by the present disclosure, the sensing electrodes are disposed in the peripheral area to sense the bending position and the bending degree of the flexible touch display device that are used to compensate and correct the capacitance between the touch electrodes in the bending position. This solves the technical problem of misjudgment of a touched position caused by a change in a capacitance between touch electrodes in a bending position when a current flexible touch display device is bent. Furthermore, the sensing electrodes may be disposed below the touch electrode leads in the peripheral area to avoid increasing an area of the peripheral area and facilitate a narrow frame design.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below with reference to the accompanying drawings. Other embodiments obtained by those skilled in the art based on the embodiments of the present disclosure without any creative labor belong to the scope of the present invention. In addition, directional terms mentioned in the present disclosure, such as "up", "down", "parallel", and "vertical", are merely used to indicate the direction of the accompanying drawings for illustrating the present invention rather than limiting the present invention. Furthermore, term "a/an", unless specifically defined otherwise, is intended to comprise plural forms. Terms "first" and "second" are only used for descriptive purposes, and cannot be understood as indicating or implying relative importance or implicitly indicating a number of technical features indicated. The features defined by "first" and "second" may explicitly or implicitly comprise one or more of the features.

Figure 1:
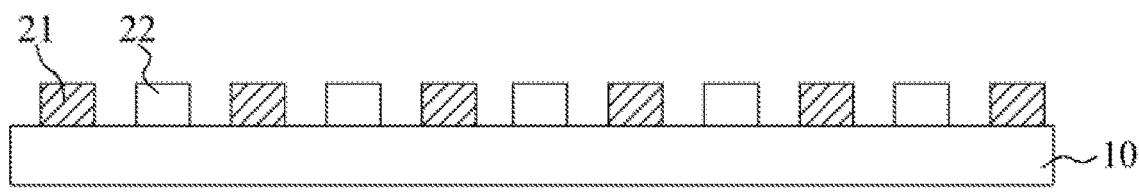
FIG. 1 is a schematic cross-sectional view of a flexible touch display device in a flat state in the prior art.
Figure 2:
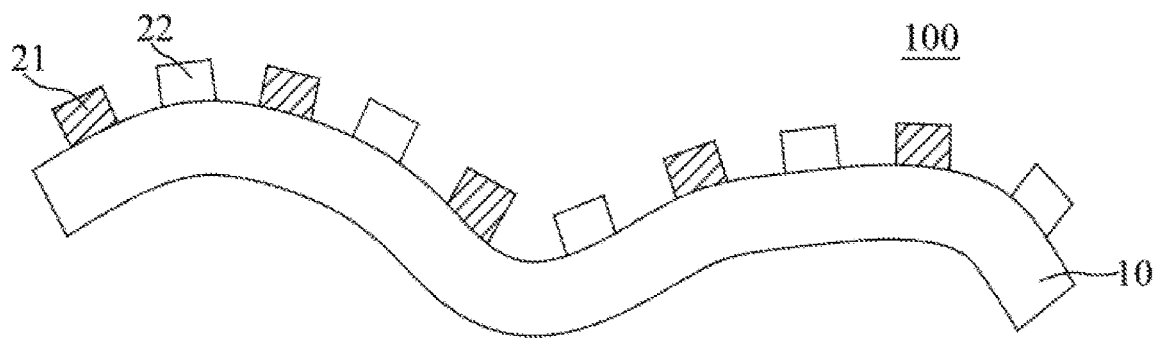
FIG. 2 is a schematic cross-sectional view of a flexible touch display device in a bent state in the prior art.
Figure 3:
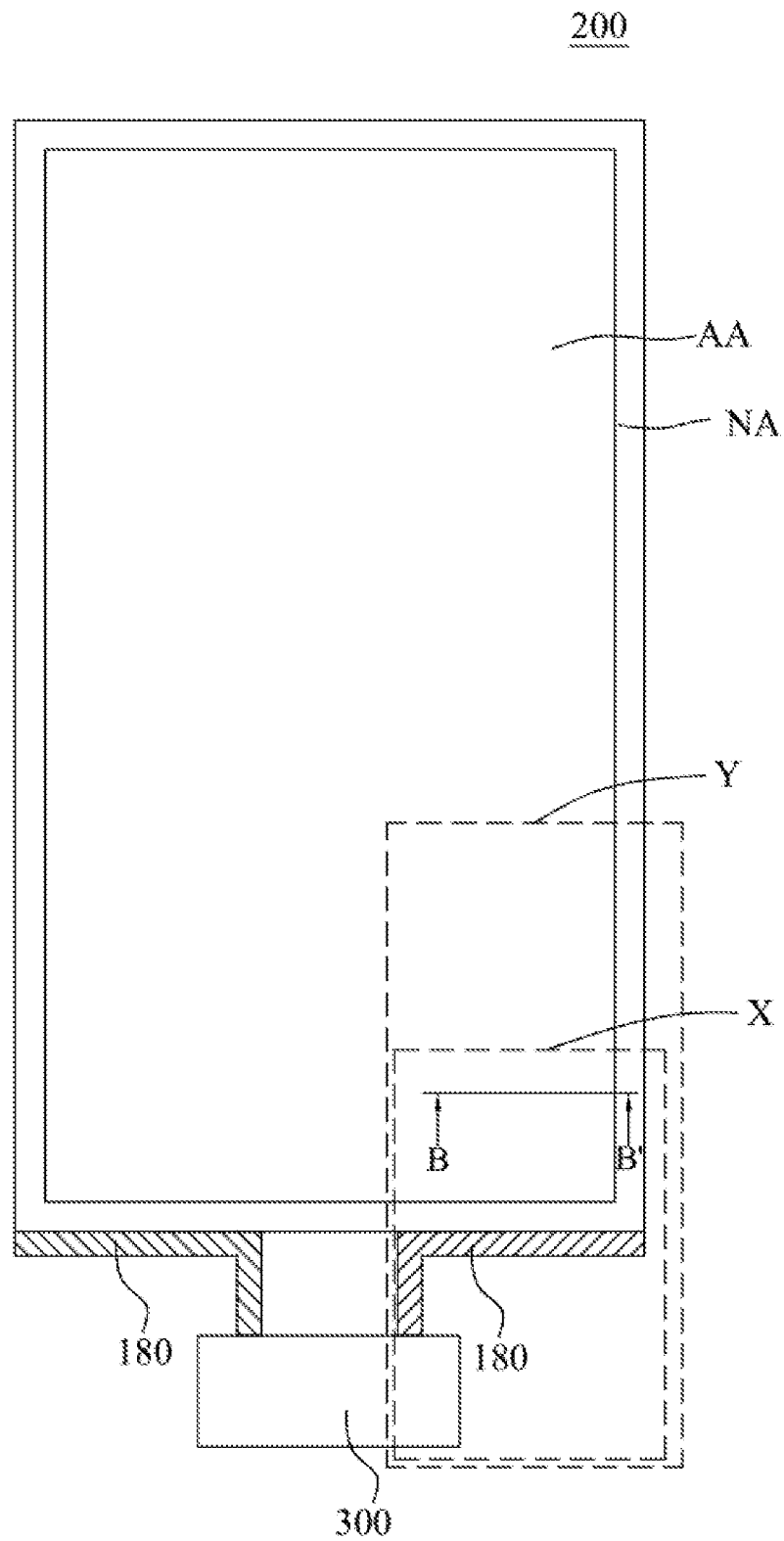
FIG. 3 is a schematic diagram of a flexible touch display device according to an embodiment of the disclosure.
Figure 4:
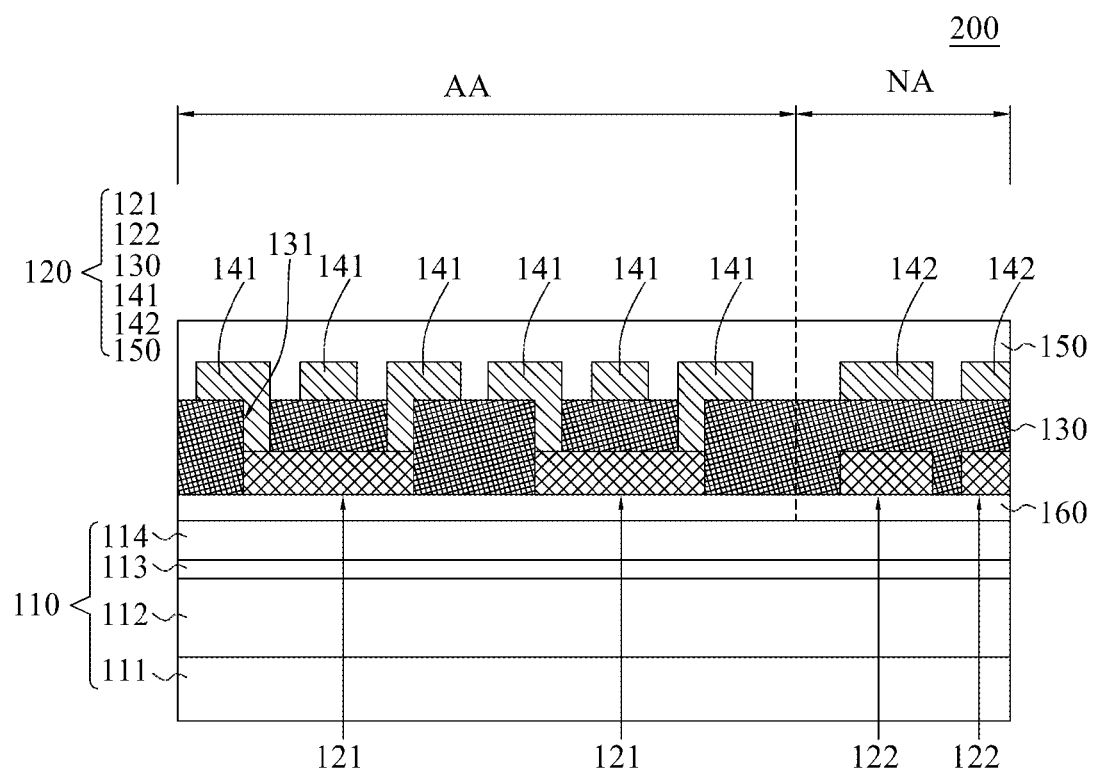
FIG. 4 is a schematic cross-sectional view of the flexible touch display device of FIG. 3 along line B-B'.

Please refer to FIG. 3 and FIG. 4. The present disclosure provides a flexible touch display device 200 comprising a flexible display panel 110, a touch-sensing structure 120, a bonding area 180, and a touch chip 300. The flexible display panel 110 comprises a display area AA and a peripheral area NA surrounding the display area AA. The flexible display panel 110 may be an organic light emitting diode display panel, which sequentially, from bottom to top, comprises a flexible substrate 111, a thin-film transistor layer 112, an organic light emitting diode layer 113, and a thin-film encapsulation layer 114. The touch-sensing structure 120 is formed on the thin-film encapsulation layer 114. The flexible substrate 111 may be made of a flexible insulating polymer material, such as polyimide (PI), polycarbonate (PC), polyethersulfone (PES), polyethylene terephthalate (PET), Polyethylene naphthalate (PEN), and thin-film fiber-reinforced polymer (FRP). The thin-film transistor layer 112 comprises a plurality of thin-film transistors. Each of the thin-film transistors comprises a gate electrode layer, an insulating layer, an active layer, and a source-drain layer. The thin-film transistors may comprise hydrogenated amorphous silicon thin-film transistors (a-TFT: H), low-temperature poly TFTs (LTPS), organic thin-film transistors (OTFT) and/or metal oxide thin-film transistors, but are not limited thereto. The thin-film transistors may be bottom-gate, top-gate, or double-gate thin-film transistors. The organic light emitting diode layer 113 comprises a plurality of organic light emitting diodes for emitting light. Each of the organic light emitting diodes may sequentially comprise an anode layer, a hole injection layer, a hole transport layer, a light emitting layer, an electron transport layer, an electron injection layer, and a cathode layer. The thin-film transistors are electrically connected to the organic light emitting diodes in the organic light emitting diode layer 113 and configured to drive the organic light emitting diodes to emit light. The thin-film encapsulation layer 114 is configured to protect the organic light-emitting diodes in the organic light-emitting diode layer 113 from corrosion and damage by moisture and oxygen in the atmosphere, and improve a capability of the flexible display panel 110 to withstand stress. The thin-film encapsulation layer 114 may have a structure of inorganic layer/organic layer/inorganic layer. The inorganic layer of the thin-film encapsulation layer 114 is configured to prevent the organic light emitting diodes in the organic light emitting diode layer 113 from contact with the moisture and oxygen in the atmosphere, so as to prevent the moisture and oxygen in the atmosphere from damaging the organic light emitting diodes. The inorganic layer may be made of aluminum oxide, silicon oxide, magnesium oxide, or a combination thereof. The organic layer of the thin-film encapsulation layer 114 is made of a soft organic material, and thus may be configured to release stress experienced by the flexible display panel 110. The organic layer may be made of alucone, or an organic-inorganic hybrid film comprising aluminum, titanium, zinc, or iron. In an embodiment, the flexible touch display device 200 may further comprise a second insulating layer 160 disposed on the thin-film encapsulation layer 114. The touch-sensing structure 120 is formed on the second insulating layer 160. The second insulating layer 160 may be made by a low-temperature process. The second insulating layer 160 may be made of silicon nitride, silicon oxide, or a combination thereof.

The touch-sensing structure 120 is disposed on the flexible display panel 110 and comprises a plurality of bridge points 121, a plurality of sensing electrodes 122, a first insulating layer 130, a plurality of touch electrodes 141, a plurality of touch electrode leads 142, and a flat layer 150. The bridge points 121 are disposed on the display area AA of the flexible display panel 110. The sensing electrodes 122 are disposed on the peripheral area NA of the flexible display panel 110 and are configured to sense a bending position and a bending degree of the flexible display panel 110. The sensing electrodes 122 may be in a same layer and made of a same material as the bridge points 121 to avoid adding additional processes. The first insulating layer 130 covers the bridge points 121, the sensing electrodes 122, and the flexible display panel 110. The first insulating layer 130 is provided with a plurality of via holes 131 in the display area AA to expose two opposite sides of each of the bridge points 121. The touch electrodes 141 are disposed on the first insulation layer 130 in the display area AA and are electrically connected to the bridge points 121 through the via holes 131 to form a metal mesh structure for sensing a touched position of the flexible touch display device 200. The touch electrode leads 142 are disposed on the first insulating layer 130 in the peripheral area NA. The bonding area 180 is disposed on a side of the flexible display panel 110 and/or the touch-sensing structure 120. The touch electrode leads 142 may be in a same layer and made of a same material as the touch electrodes 141 to reduce manufacturing processes. The sensing electrodes 122 may be disposed below the touch electrode leads 142 to avoid increasing an area of the peripheral area NA and facilitate a narrow frame design. The bridge points 121, the sensing electrodes 122, the touch electrodes 141, and the touch electrode leads 142 may be made of a highly conductive and highly flexible metal material. Specifically, the bridge points 121, the sensing electrodes 122, and the touch electrodes 141 may be single-layer metal structures such as aluminum, titanium, and molybdenum, or a double-layer metal structure such as aluminum/titanium (Al/Ti) and molybdenum/aluminum (Mo/Al), or a three-layer metal structure such as titanium/aluminum/titanium (Ti/Al/Ti) and molybdenum/aluminum/molybdenum (Mo/Al/Mo). The flat layer 150 covers the touch electrodes 141, the touch electrode leads 142, and the first insulating layer 130. The flat layer 150 may be made of an organic photoresist material. The touch-sensing structure 120 may be formed on the flexible display panel 110 using a low-temperature process (process temperature is less than 90 □).

Figure 5:
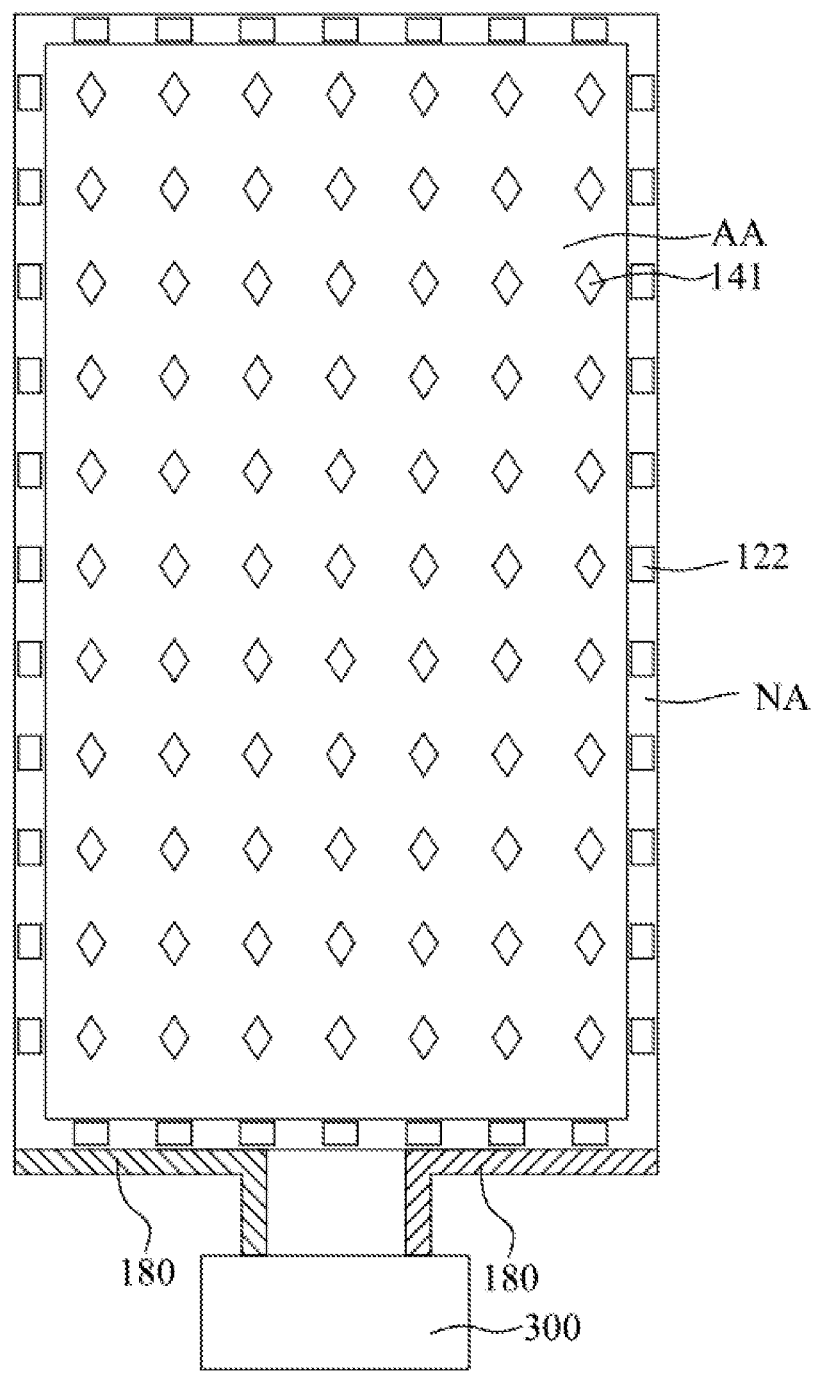
FIG. 5 is a schematic diagram of a first arrangement of bridge points and sensing electrodes in a flexible touch display device according to an embodiment of the disclosure.

Please refer to FIG. 5, in an embodiment, the bridge points 121 are disposed in an array in the display area AA. Columns of the bridge points 121 are equally spaced, and rows of the bridge points 121 are also equally spaced. The sensing electrodes 122 are disposed in the peripheral area NA and are in same rows or same columns as the bridge points 121.

Figure 6:
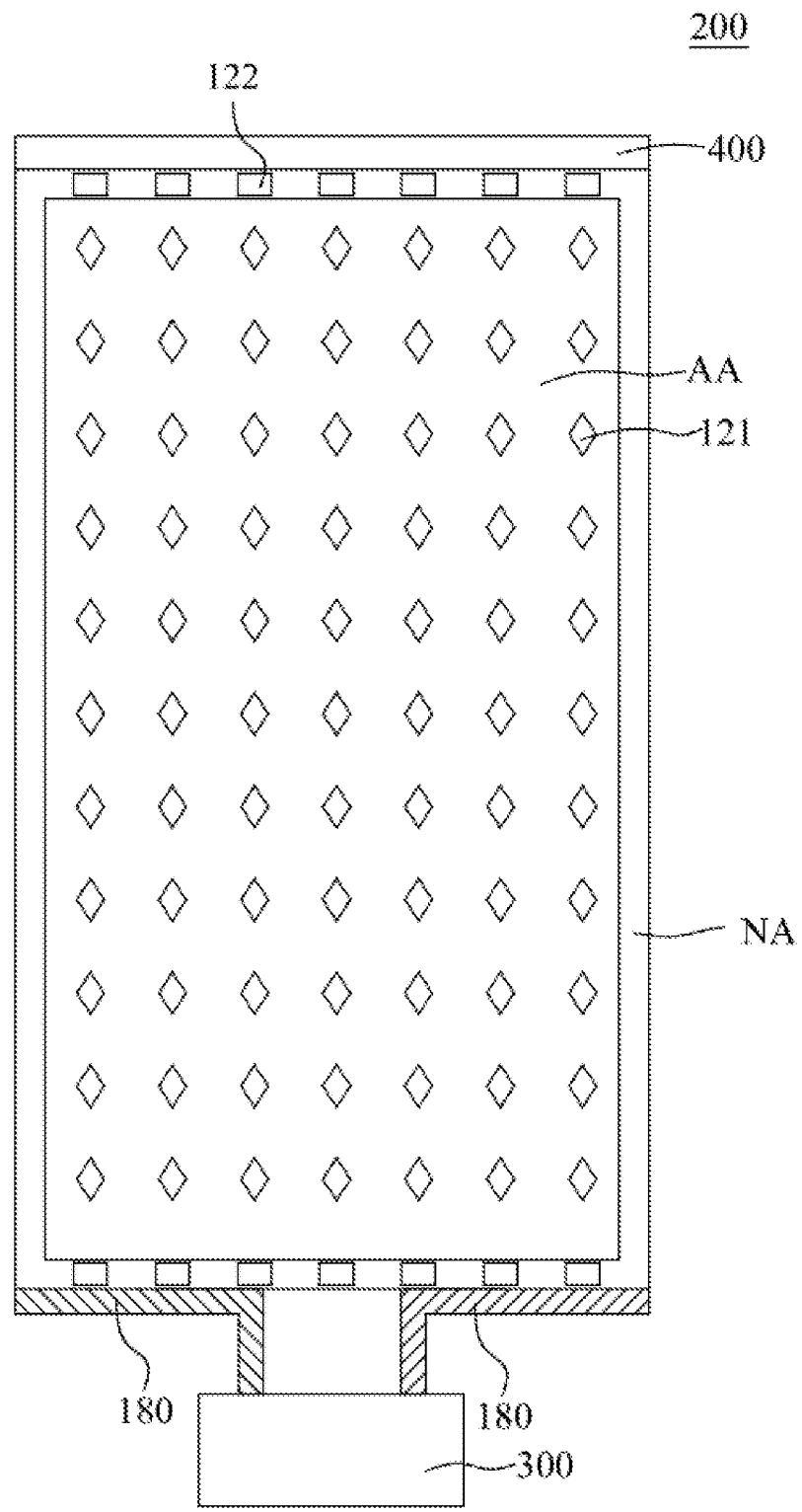
FIG. 6 is a schematic diagram of a second arrangement of bridge points and sensing electrodes in a flexible touch display device according to an embodiment of the disclosure.

Please refer to FIG. 6, in an embodiment, the flexible touch display device 200 further comprises a scroll 400 connected to a side of the flexible touch display device 200 for rolling or unrolling the flexible touch display device 200. The sensing electrodes 122 are disposed on one or two sides of the peripheral area NA parallel to the scroll 400.

Figure 7:
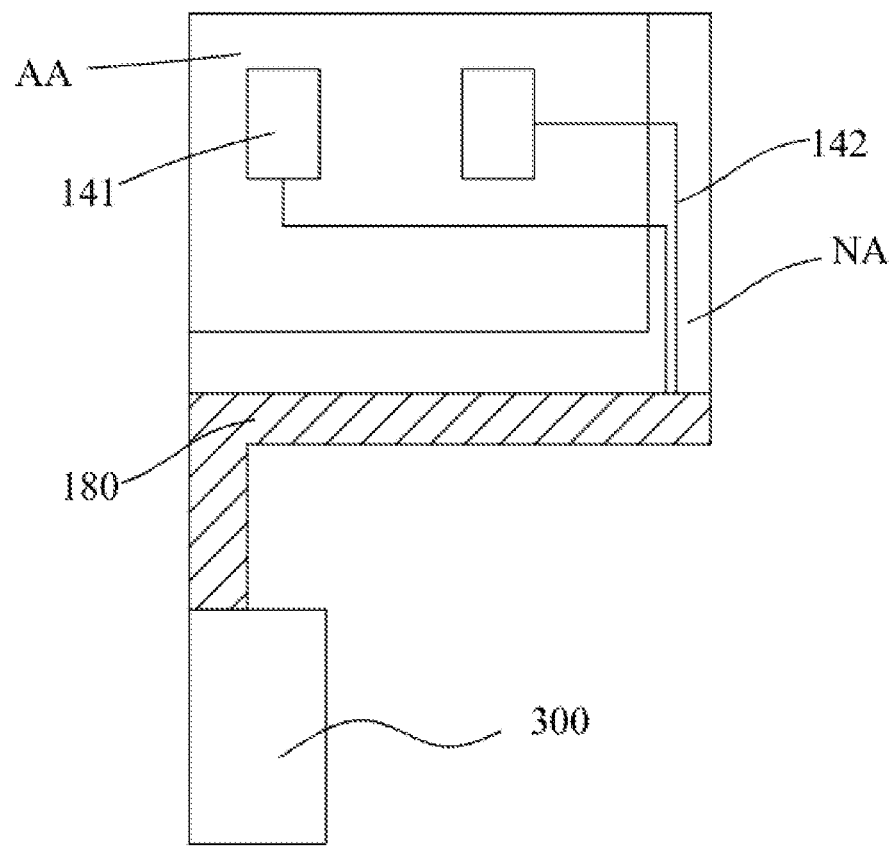
FIG. 7 is a schematic diagram of an arrangement of touch electrodes and touch electrode leads in X area of FIG. 3.

Please refer to FIG. 7, an end of each touch electrode lead 142 is electrically connected to one of the touch electrodes 141, and the other end of each touch electrode lead 142 is bonded to the bonding area 180 and is electrically connected to the touch chip 300.

Figure 8:
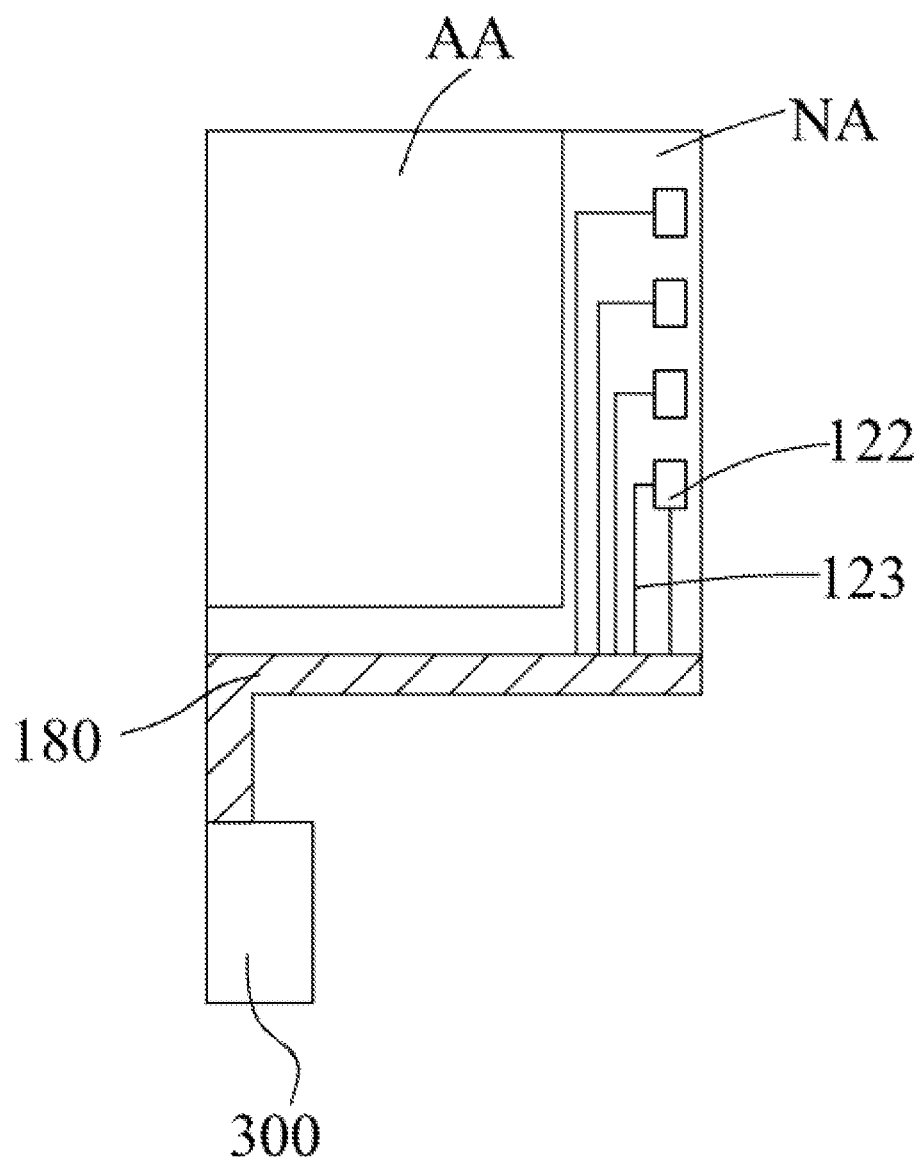
FIG. 8 is a schematic diagram of an arrangement of sensing electrodes and sensing electrode leads in Y area of FIG. 3.

Please refer to FIG. 8, the sensing electrodes 122 may be electrically connected to the touch chip 300 through a plurality of sensing electrode leads 123. The sensing electrode leads 123 are bonded to the bonding area 180. When a finger or a stylus touches the display area AA, a capacitance between the touch electrodes 141 in the touched position change and then forms a touch signal. That is, the touch signal is a capacitance change amount between the touch electrodes 141 in the touched position. Then, the touch signal is transmitted to the touch chip 300 through the touch electrode leads 142, and the touch chip 300 recognizes the touched position by processing the touch signal. When the flexible touch display device 200 is touched in a bent state, the sensing electrodes 122 in a bending position generate a bending signal to the touch chip 300. After the touch chip 300 recognizes the bending position and a bending degree thereof by processing the bending signal, the touch chip 300 compensates and corrects the touch signal generated by the touch electrodes 141 in the bending position. Therefore, the capacitance between the touch electrodes 141 in the bending position is prevented from being changed due to change in a distance between the touch electrodes 141, thereby avoiding misjudgment of the touched position. In this embodiment, please refer to FIGS. 8-11, the sensing electrodes 122 are mutual-capacitance sensing electrodes 80.

Figure 9:
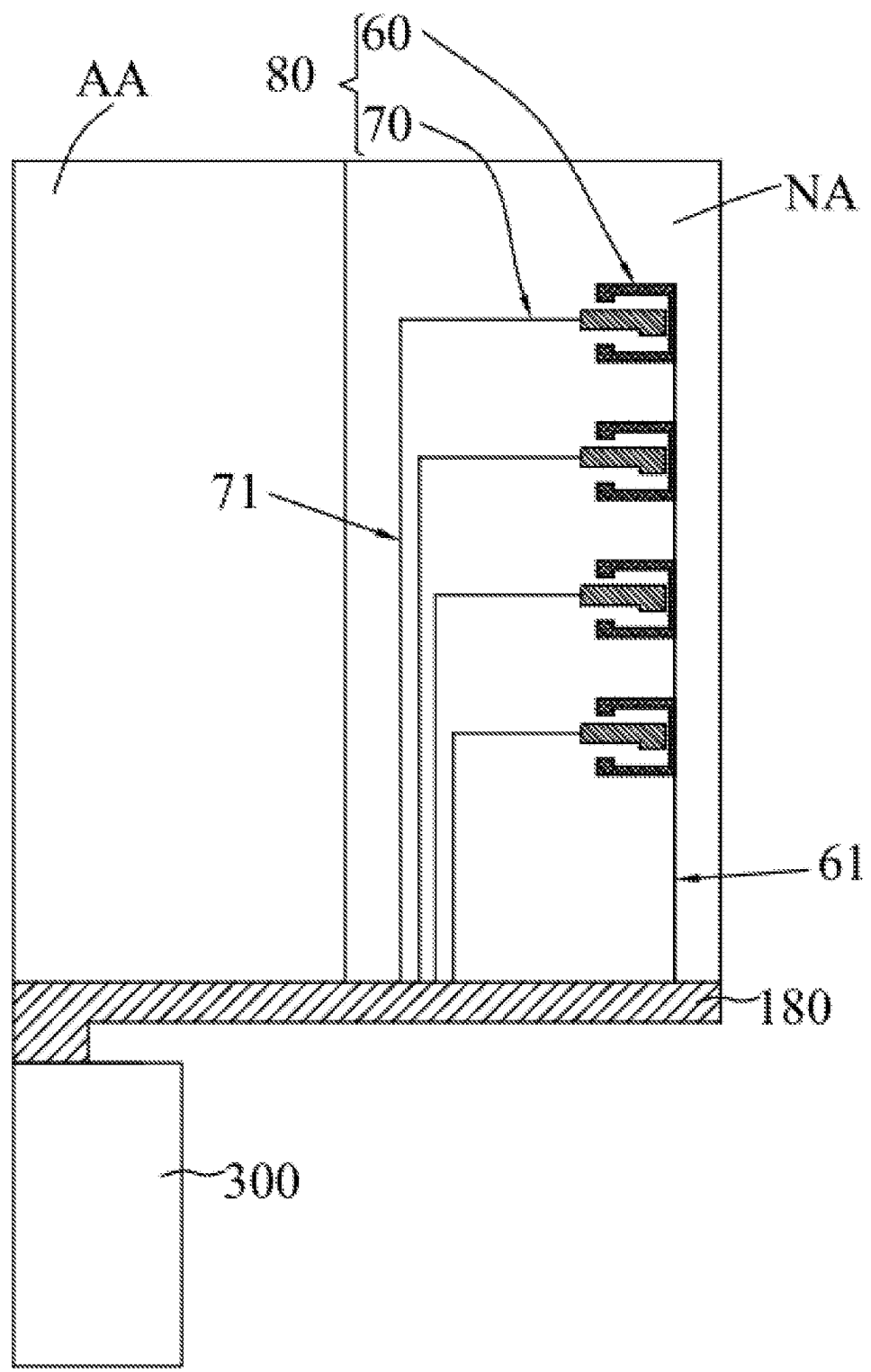
FIG. 9 is a schematic diagram illustrating that each sensing electrode of FIG. 8 is a first type of mutual-capacitance sensing electrode.
Figure 10:
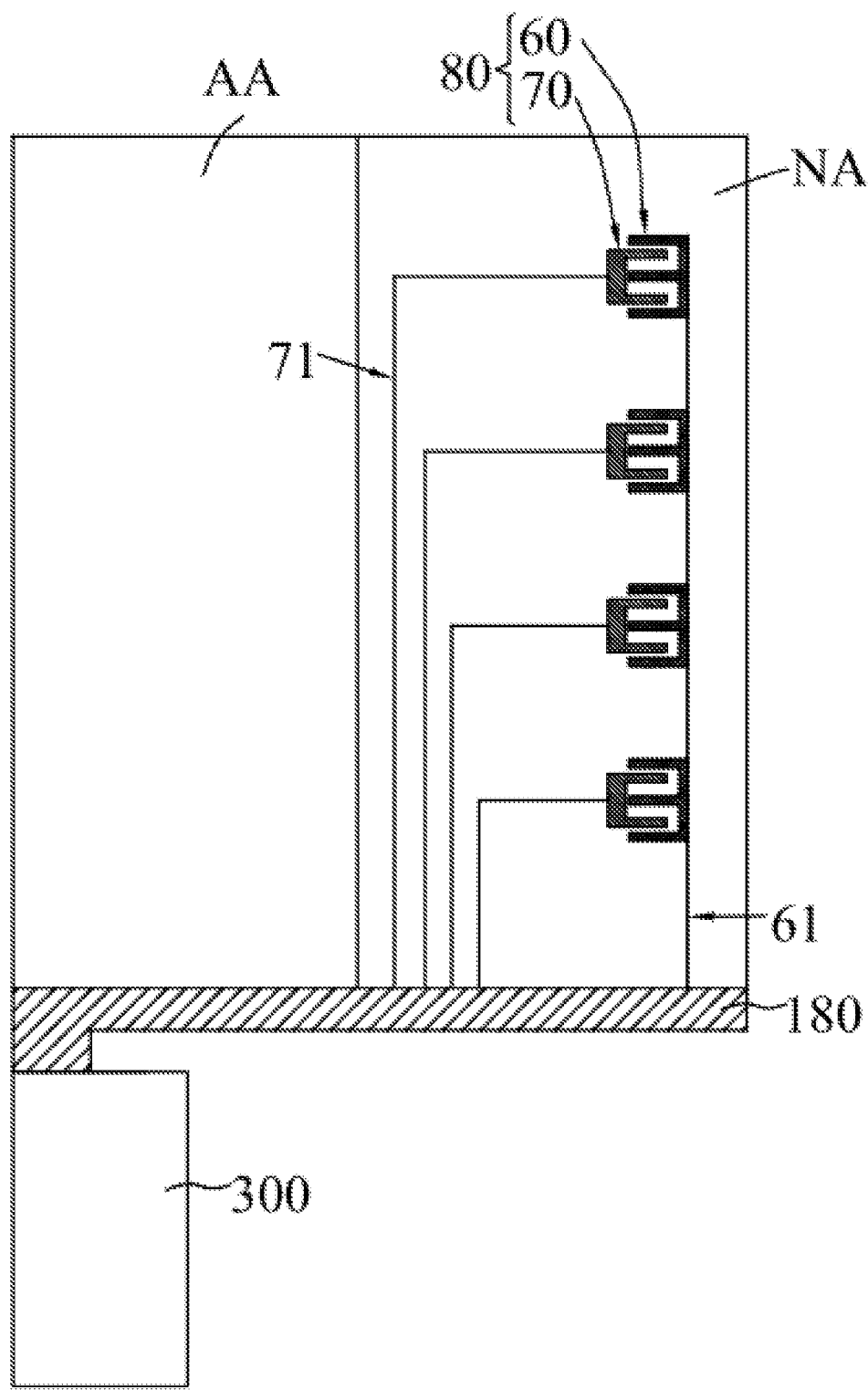
FIG. 10 is a schematic diagram illustrating that each sensing electrode of FIG. 8 is a second type of mutual-capacitance sensing electrode.
Figure 11:
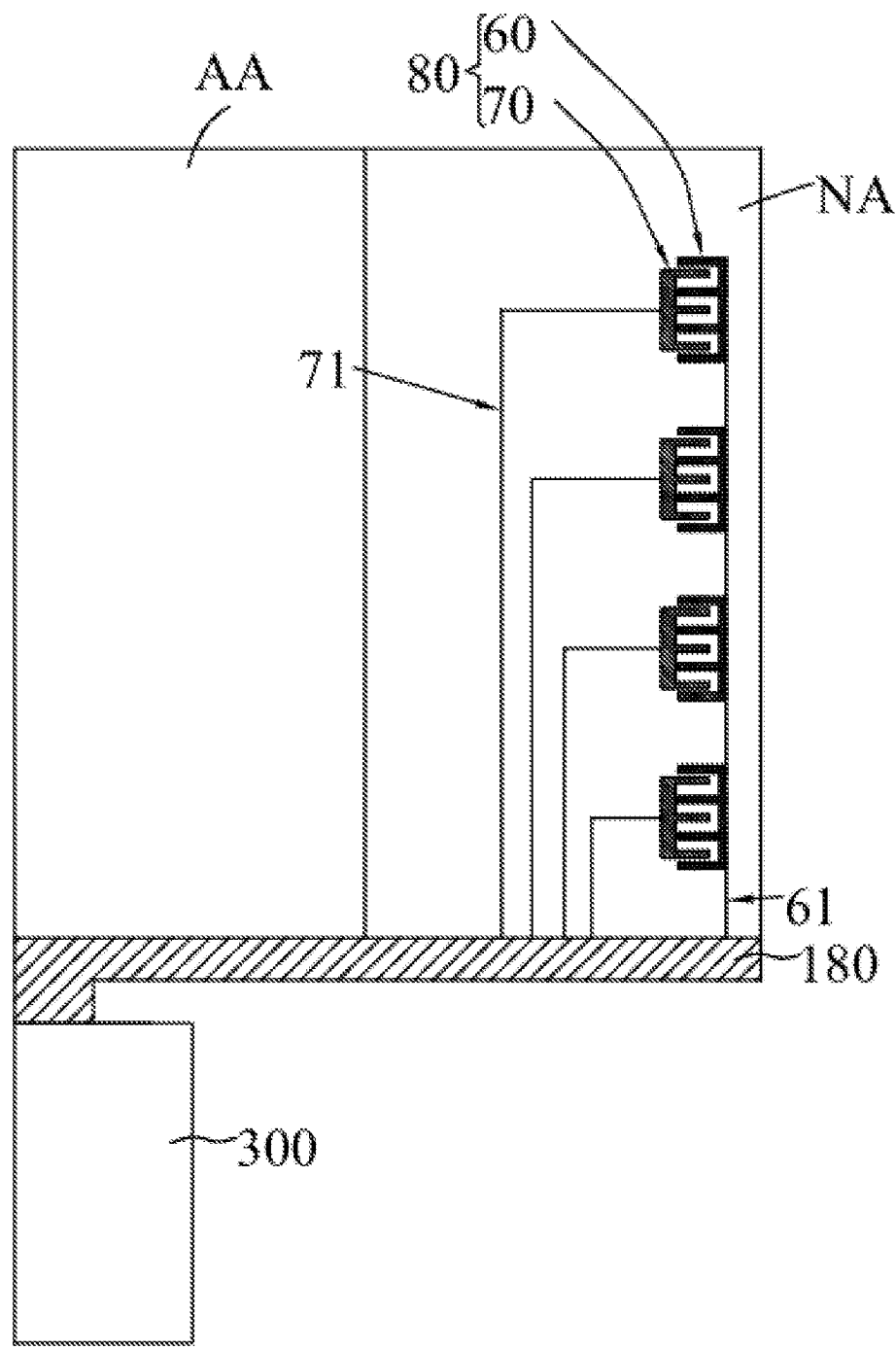
FIG. 11 is a schematic diagram illustrating that each sensing electrode of FIG. 8 is a third type of mutual-capacitance sensing electrode.

Please refer to FIGS. 9-11, which are schematic diagrams of three types of the mutual-capacitance sensing electrodes 80. Each of the sensing electrodes 80 comprises a transmitting electrode 60 and a receiving electrode 70, and the transmitting electrode 60 and the receiving electrode 70 generate a capacitance. When the flexible touch display device 200 is bent, a distance between the transmitting electrode 60 and the receiving electrode 70 of the mutual-capacitance sensing electrode 80 in a bending position is changed, thereby changing the capacitance between the transmitting electrode 60 and the receiving electrode 70. The bending signal is a capacitance change amount between the transmitting electrode 60 and the receiving electrode 70 of the mutual capacitance sensing electrode 80 in the bending position. In this embodiment, the transmitting electrode 60 and the receiving electrode 70 are comb-shaped but are not limited thereto. As long as the transmitting electrode 60 and the receiving electrode 70 are designed to be interlaced and matched with each other to achieve effect of a mutual-capacitance sensing electrode, they can be applied to the present invention. FIGS. 9-11 are only used to illustrate the transmitting electrode 60 and the receiving electrode 70 of the mutual-capacitance sensing electrode 80 and are not intended to limit the present invention. Any design similar to FIGS. 9-11 is also within a scope of the present invention. Intervals of the mutual-capacitance-type sensing electrodes 80 may be equal. Please refer to FIGS. 8-11, the sensing electrode leads 123 comprises a transmitting electrode lead 61 and a plurality of receiving electrode leads 71. The transmitting electrodes 60 are electrically connected to the transmitting electrode lead 61. Each of the receiving electrodes 70 is electrically connected to each of the receiving electrode leads 71. The transmitting electrode lead 61 and the receiving electrode leads 71 are bonded to the bonding area 180 and electrically connected to the touch chip 300. The touch chip 300 sequentially emits excitation signals through the transmitting electrode lead 61 and the transmitting electrodes 60. The receiving electrodes 70 sequentially receive the excitation signals and transmit the excitation signals back to the touch chip 300 through the receiving electrode leads 71. In this way, the touch chip 300 obtains capacitance values of all the mutual-capacitance sensing electrodes 80, calculates a capacitance change amount of each mutual-capacitance sensing electrode 80, and then calculates the bending position and a bending degree thereof.

Figure 12:
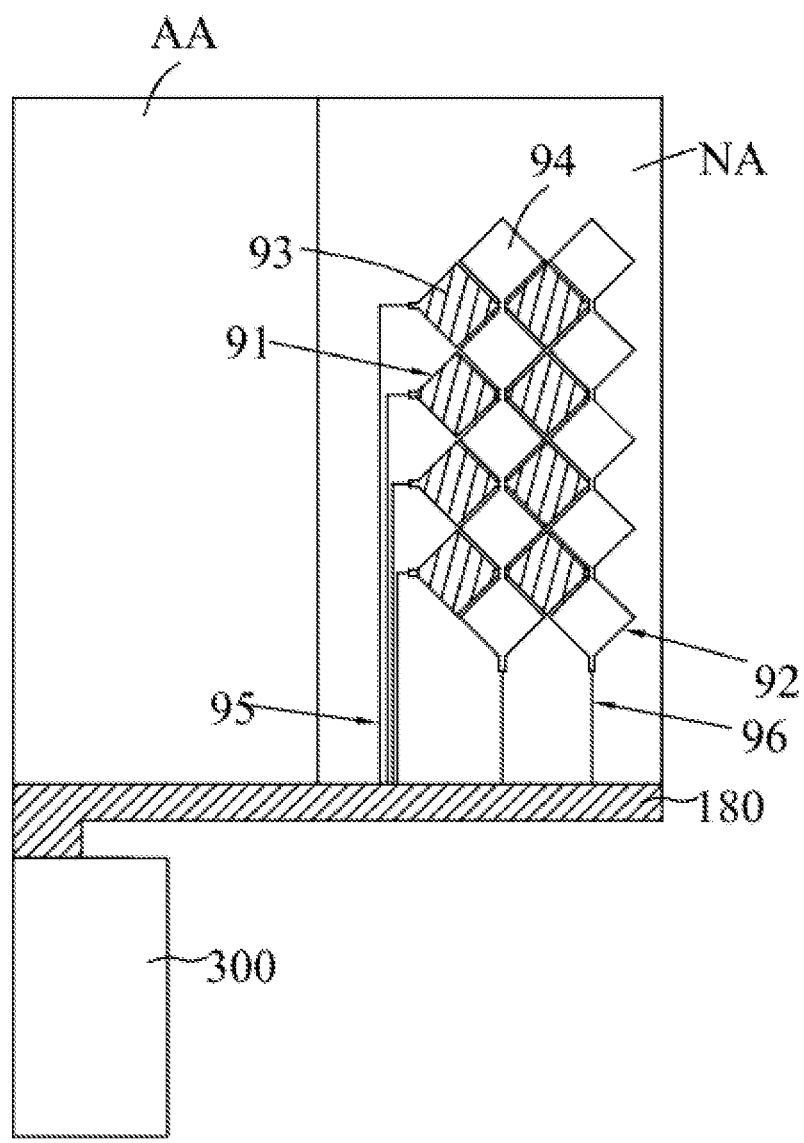
FIG. 12 is a schematic diagram illustrating that each sensing electrode of FIG. 8 is another type of mutual-capacitance sensing electrode.
Figure 13:
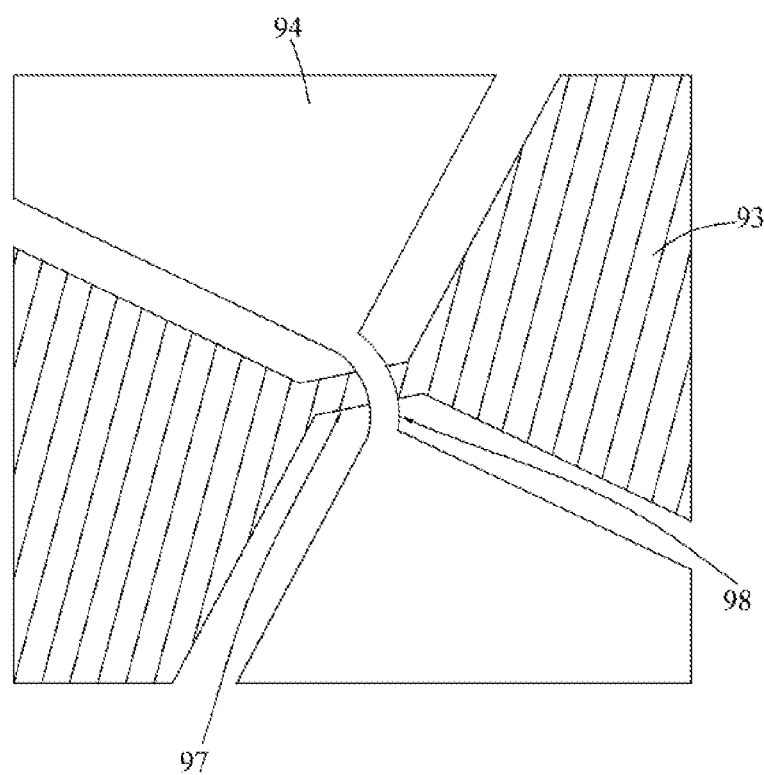
FIG. 13 is a partially enlarged view of the mutual-capacitance sensing electrodes of FIG. 12.

In an embodiment, please refer to FIG. 8, FIG. 12, and FIG. 13, the sensing electrodes 122 may be another type of mutual-capacitance sensing electrodes 90 comprising a plurality of driving sensing wires 91 and a plurality of receiving sensing wires 92 perpendicularly crossing each other. Each of the driving sensing wires 91 comprises a plurality of first electrodes 93 connected in series by a plurality of connection lines 97. Each of the receiving sensing wires 92 comprises a plurality of second electrodes 94 connected in series by a plurality of connection lines 98. In this embodiment, the first electrodes 93 and the second electrodes 94 are diamond-shaped but are not limited thereto. In this embodiment, please refer to FIG. 13, the first electrodes 93 and the second electrodes 94 are disposed on a same layer, and the connection line 98 between the second electrodes 94 bends across the connection line 97 between the first electrodes 93. In another embodiment, the driving sensing wires 91 and the receiving sensing wires 92 are disposed on two different layers, and a dielectric layer (not shown) is disposed between the two layers. Each of the driving sensing wires 91 and each of the receiving sensing wires 92 generate a capacitance at their intersection. When the flexible touch display device 200 is bent, the driving sensing wire 91 and the receiving sensing wire 92 in a bending position are deformed at their intersection, and thus the capacitance generated by the driving sensing wire 91 and the receiving sensing wire 92 at their intersection is changed. The bending signal is a capacitance change amount at the intersection of the driving sensing wire 91 and the receiving sensing wire 92 in the bending position. The sensing electrode leads 123 comprise a plurality of transmitting leads 95 and a plurality of receiving leads 96. Each of the driving sensing wires 91 is electrically connected to each of the transmitting leads 95. Each of the receiving sensing wires 92 is electrically connected to each of the receiving leads 96. The transmitting leads 95 and the receiving leads 96 are bonded to the bonding area 180 and electrically connected to the touch chip 300. The touch chip 300 sequentially emits excitation signals through the transmitting leads 95 and the driving sensing wires 91. The receiving sensing wires 92 sequentially receive the excitation signals and transmit the excitation signals back to the touch chip 300 through the receiving leads 96. In this way, the touch chip 300 obtains capacitance values at all intersections, calculates a capacitance change amount at each intersection, and then calculates the bending position and a bending degree thereof.

Figure 14:
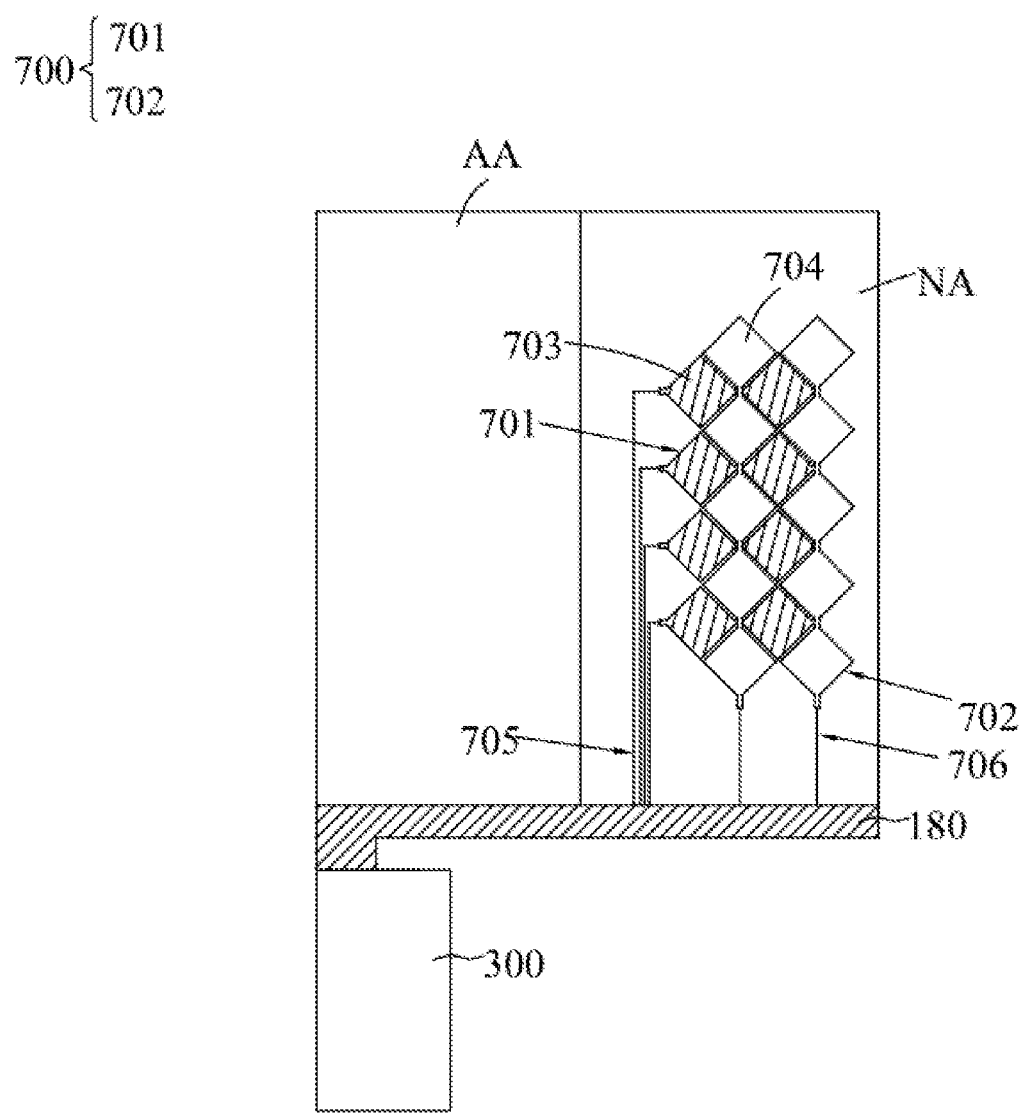
FIG. 14 is a schematic diagram illustrating that sensing electrodes of FIG. 8 are self-capacitance sensing electrodes.
Figure 15:
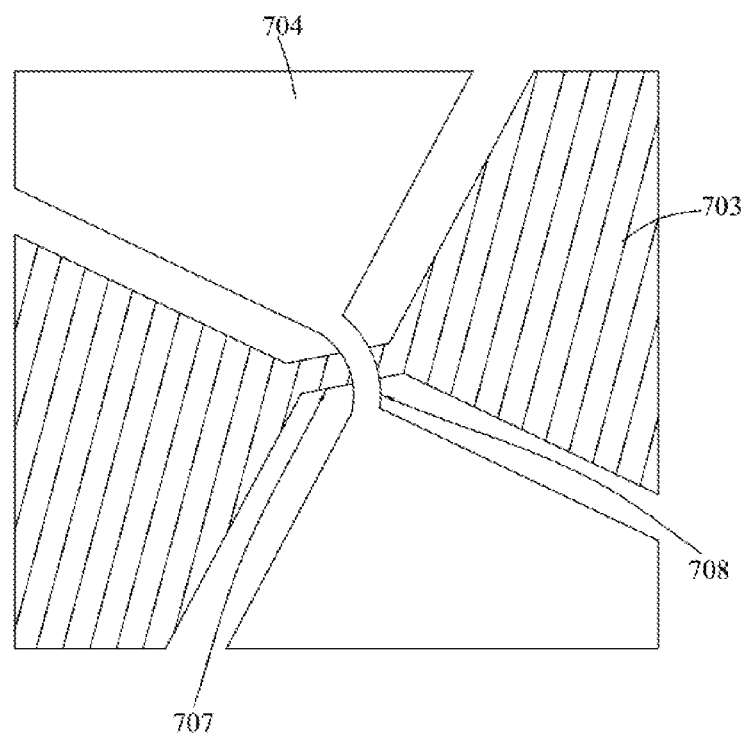
FIG. 15 is a partially enlarged view of the self-capacitance sensing electrodes of FIG. 14.

In an embodiment, please refer to FIG. 8, FIG. 14, and FIG. 15, the sensing electrodes 122 may be self-capacitance sensing electrodes 700 comprising a plurality of first conductive lines 701 and a plurality of second conductive lines 702 perpendicularly crossing each other. Each of the first conductive lines 701 comprises a plurality of first electrodes 703 connected in series by a plurality of connection lines 707. Each of the second conductive lines 702 comprises a plurality of second electrodes 704 connected in series by a plurality of connection lines 708. In this embodiment, the first electrodes 703 and the second electrodes 704 are diamond-shaped but are not limited thereto. In this embodiment, please refer to FIG. 15, the first electrodes 703 and the second electrodes 704 are disposed on a same layer, and the connection line 708 between the second electrodes 704 bends across the connection line 707 between the first electrodes 703. In another embodiment, the first conductive lines 701 and the second conductive lines 702 are disposed on two different layers, and a dielectric layer (not shown) is disposed between the two layers. The first conductive lines 701 and the second conductive lines 702 are grounded. Capacitances are generated between the first conductive lines 701 and the ground (not shown) and between the second conductive lines 702 and the ground. When the flexible touch display device 200 is bent, the first conductive line 701 and the second conductive line 702 in a bending position are deformed, and thus the capacitances generated between the first conductive lines 701 and the ground and between the second conductive lines 702 and the ground are changed. The bending signal is a capacitance change amount between the first conductive lines 701 or the second conductive lines 702 in the bending position and the ground. The sensing electrode leads 123 comprise a plurality of first leads 705 and a plurality of second leads 706. Each of the first conductive lines 701 is electrically connected to each of the first leads 705. Each of the second conductive lines 702 is electrically connected to each of the second leads 706. The first leads 705 and the second leads 706 are bonded to the bonding area 180 and electrically connected to the touch chip 300. In order to obtain capacitance values between the first conductive lines 701 and the ground and between the second conductive lines 702 and the ground, the touch chip 300 sequentially detects the first conductive lines 701 extending in a same direction, and then sequentially detects the second conductive lines 702 extending in another direction. And then, the touch chip 300 calculates capacitance change amounts between each first conductive line 701 and the ground and between each second conductive line 702 and the ground, and then calculates the bending position and a bending degree thereof.

Figure 16:
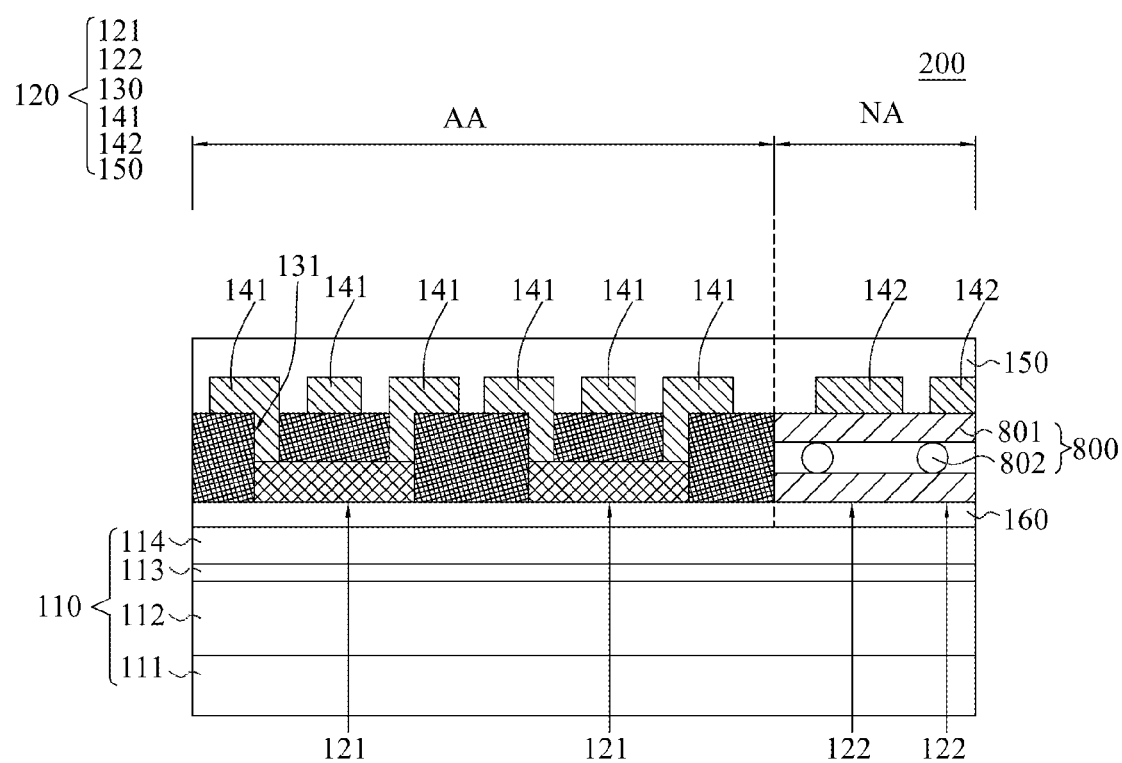
FIG. 16 is a schematic diagram illustrating that the sensing electrodes of FIG. 4 are resistance sensing electrodes.

In an embodiment, please refer to FIG. 8 and FIG. 16, the sensing electrodes 122 may be resistance sensing electrodes 800. Each of the resistance sensing electrodes 800 comprises two conductive layers 801 and a plurality of spacers 802 separating the two conductive layers. The spacers 802 are configured to distance the two conductive layers 801 from each other. Only when the flexible touch display device 200 is bent, the two conductive layers 801 will contact each other at a bending position. In other words, the spacers 802 are configured to prevent the two conductive layers 801 from being short-circuited due to contact with each other when the flexible touch display device 200 is not bent, thereby avoiding malfunction. The spacers 802 may be made of polyester material and may be shaped as spheres. When the flexible touch display device 200 is bent, the two conductive layers 801 in a bending position cause a short circuit due to contact with each other, thereby generating a voltage drop. The bending signal is a voltage change amount between the two conductive layers 801 in the bending position. The touch chip 300 is electrically connected to the two conductive layers 801 to detect a voltage between the two conductive layers 801, calculate the voltage change amount, and then calculate the bending position and a bending degree thereof.

In the flexible touch display device provided by the present disclosure, the sensing electrodes are disposed in the peripheral area to sense the bending position and the bending degree of the flexible touch display device that are used to compensate and correct the capacitance between the touch electrodes in the bending position. This solves the technical problem of misjudgment of a touched position caused by a change in a capacitance between touch electrodes in a bending position when a current flexible touch display device is bent. Furthermore, the sensing electrodes may be disposed below the touch electrode leads in the peripheral area to avoid increasing an area of the peripheral area and facilitate a narrow frame design.

What is claimed is:

1. A flexible touch display device, comprising:
a flexible display panel comprising a display area and a peripheral area surrounding the display area;
a plurality of bridge points disposed in the display area of the flexible display panel;
a plurality of sensing electrodes disposed in the peripheral area of the flexible display panel and on a same layer as the bridge points, and configured to sense a bending position and a bending degree of the flexible display panel;
a first insulating layer disposed on surfaces of the bridge points and the sensing electrodes away from the flexible display panel, wherein the first insulating layer is provided with a plurality of via holes in the display area to expose two opposite sides of each of the bridge points;
a plurality of touch electrodes disposed in the display area and on a surface of the first insulating layer away from the flexible display panel, and electrically connected to the bridge points through the via holes to form a metal mesh structure for sensing a touched position of the flexible touch display device; and
a plurality of touch electrode leads disposed in the peripheral area, on the surface of the first insulating layer away from the flexible display panel, and on the sensing electrodes, and electrically connected to the touch electrodes.

2. The flexible touch display device according to claim 1, further comprising:
a touch chip electrically connected to the touch electrode leads, wherein when the display area is touched, the touch electrodes in the touched position generate a touch signal, the touch signal is transmitted to the touch chip through the touch electrode leads, and the touch chip recognizes the touched position by processing the touch signal.

3. The flexible touch display device according to claim 2, wherein the touch signal is a capacitance change amount between the touch electrodes in the touched position.

4. The flexible touch display device according to claim 2, wherein the sensing electrodes are electrically connected to the touch chip;
when the flexible touch display device is touched in a bent state, the sensing electrodes in the bending position generate a bending signal to the touch chip; and
after the touch chip recognizes the bending position and the bending degree by processing the bending signal, the touch chip compensates and corrects the touch signal generated by the touch electrodes in the bending position.

5. The flexible touch display device according to claim 4, wherein each of the sensing electrodes comprises a comb-shaped transmitting electrode and a comb-shaped receiving electrode, the transmitting electrode and the receiving electrode generate a capacitance, and the bending signal is a capacitance change amount between the transmitting electrode and the receiving electrode of the sensing electrode in the bending position.

6. The flexible touch display device according to claim 4, wherein the sensing electrodes comprise a plurality of driving sensing wires and a plurality of receiving sensing wires perpendicularly crossing each other, each of the driving sensing wires and each of the receiving sensing wires generate a capacitance at their intersection, and the bending signal is a capacitance change amount at the intersection of the driving sensing wire and the receiving sensing wire in the bending position.

7. The flexible touch display device according to claim 4, wherein the sensing electrodes comprise a plurality of conductive lines crossing each other perpendicularly, the conductive lines generate capacitances with ground, and the bending signal is a capacitance change amount between the conductive line in the bending position and the ground.

8. The flexible touch display device according to claim 4, wherein each of the sensing electrodes comprises two conductive layers and a plurality of spacers separating the two conductive layers, and the bending signal is a voltage change amount caused by the two conductive layers in contact with each other in the bending position.

9. The flexible touch display device according to claim 1, further comprising a scroll connected to a side of the flexible touch display device for rolling or unrolling the flexible touch display device, wherein the sensing electrodes are disposed on a side of the peripheral area that is parallel to the scroll.

10. The flexible touch display device according to claim 1, wherein the bridge points are disposed in an array in the display area, and the sensing electrodes are disposed in the peripheral area and are in a same row or a same column as the bridge points.

* * * * *